United States Patent [19]
Schinella et al.

[11] Patent Number: 5,663,017
[45] Date of Patent: Sep. 2, 1997

[54] OPTICAL CORRECTIVE TECHNIQUES WITH RETICLE FORMATION AND RETICLE STITCHING TO PROVIDE DESIGN FLEXIBILITY

[75] Inventors: Richard Schinella, Saratoga; Keith Chao, San Jose, both of Calif.

[73] Assignee: LSI Logic Corporation, Milpitas, Calif.

[21] Appl. No.: 477,827

[22] Filed: Jun. 7, 1995

[51] Int. Cl.⁶ .................................................. G03F 9/00
[52] U.S. Cl. .............................. 430/5; 430/311; 430/312; 430/314
[58] Field of Search ........................... 430/5, 311–313, 430/314, 315, 317

[56] References Cited

U.S. PATENT DOCUMENTS

| | | | |
|---|---|---|---|
| 4,764,432 | 8/1988 | Kalbitzer | 428/446 |
| 5,208,125 | 5/1993 | Lowrey et al. | 430/5 |
| 5,437,946 | 8/1995 | McCoy | 430/321 |
| 5,439,764 | 8/1995 | Alter et al. | 430/5 |

*Primary Examiner*—S. Rosasco
*Attorney, Agent, or Firm*—Poms, Smith, Lande & Rose

[57] ABSTRACT

Method and apparatus for forming large scale fields suitable for use in the fabrication of integrated circuit structures having submicron dimensions. The method includes subdividing the large scale field into a plurality of subfields along the boundaries of functional components forming a very large scale integrated circuit. Stitching the subfields into the large scale field is then substantially simplified since the number and dimensions of conductive interconnects between the functional components can be more easily accommodated. The large scale field further includes a custom portion and a standard portion of functional components. Reticle formation of the standard portion involves optical correction techniques. Reticle formation of the custom portion may involve standard reticle formation techniques.

25 Claims, 2 Drawing Sheets

OPTICAL CORRECTIVE TECHNIQUES WITH RETICLE FORMATION AND RETICLE STITCHING TO PROVIDE DESIGN FLEXIBILITY

FIELD OF THE INVENTION

The present invention relates generally to integrated circuits, and, more particularly, to methods and apparatus for fabricating integrated circuit elements on a substrate die.

BACKGROUND OF THE INVENTION

As integrated circuit fabrication advances from very large scale integration (VLSI) to ultra-large scale integration (ULSI), semiconductor manufacturers continue to develop techniques to construct integrated circuits with structures having dimensions in the sub-micron range on a semiconductor substrate. Improvements in photolithographic processing techniques that can be employed to produce integrated circuits comprising several million transistors per die have substantially contributed to the miniaturization of active semiconductor devices to dimensions below a single micron. The fabrication of these semiconductor devices typically involves the transfer of circuit image patterns from a photolithographic reticle onto a photoresist layer covering a semiconductor wafer substrate using an imaging lens apparatus. The reticle is often itself constructed from a substrate of silicon dioxide and is typically patterned with areas of differing transmissivity thereon, some of these areas being opaque and others being substantially transparent. Collectively, the patterned areas of the reticle represent either the positive or negative images of an integrated circuit structure depending on whether a negative or positive photoresist is utilized. After being properly positioned and aligned over the semiconductor wafer, the reticle is then subjected to electromagnetic radiation, typically in the ultraviolet region of the spectrum. The electromagnetic radiation passes through transparent portions of the reticle, striking portions of the photoresist layer on the wafer. The resist coating is then developed and etched so as to impart a positive or negative image of the reticle pattern onto the photoresist layer remaining on the substrate.

Conventional photolithographic methods of fabricating integrated circuits on a substrate typically involve stepping a reticle and imaging apparatus across a photoresist coated substrate and then repeatedly transferring the reticle image pattern to adjacent areas on the wafer. Each of the individual areas on the wafer containing the circuitry image is termed a die. Typically, the wafer is cut or otherwise segmented at the end of the fabrication process, so that the dies are separated from one another for subsequent packaging as individual integrated circuit chips. The region of the reticle bearing the circuitry image pattern is commonly referred to as a reticle field, and the corresponding patterned region on the die is usually termed the substrate field, or chip field. Depending on the size of the substrate and individual die, a substrate may contain either a few dice or several dozen repetitions of the individual die pattern. The dice are usually arranged uniformly across the substrate in rows and columns. A wafer may undergo several imaging or photolithographic steps, depending on the complexity of the integrated circuit to be formed, with different reticles being employed at different times during the fabrication process to produce individual patterned layers on the die that collectively form the composite integrated circuit structure. This process is generally regarded as being well suited for fabricating integrated circuits having repeating structures such as DRAMs (Dynamic Random Access Memories) and SRAMs (Static Random Access Memories).

As integrated circuits become increasingly complex, however, the integrated circuit structures within an individual die have become significantly smaller and more dense. Larger reticles are often required to transfer larger and more complex circuit images to substrate fields of increased dimensions. Because of inherent image resolution limitations associated with conventional photolithographic processes, imaging and alignment errors are often introduced when fine line structures having sub-micron dimensions are produced on relatively large reticles. Current photolithographic imaging tools, as a consequence, are currently capable of patterning a field with a maximum surface area of only approximately 4.0 $cm^2$ if fine line structures with dimensions in the sub-micron range are included on the reticle.

Reductions in the dimensions of semiconductor feature sizes are further limited by the size of lenses currently used in photolithographic imaging tools. As features sizes have been reduced, lens sizes have typically increased. Current lenses on average weigh in excess of 450 pounds and cost several million dollars. The large size and high cost of current lenses make further increases in lens sizes highly undesirable. Alternatively, some conventional manufacturing facilities include i-line (Hg) step-and-repeat camera systems for production of semiconductor structures having features of highly reduced dimensions. Unfortunately, typical costs for the i-line systems are in excess of 2.5 million dollars. Deep ultraviolet wavelength (DUV) reflective optics systems available from Silicon Valley Group and DUV refractive systems are also typically regarded as too expensive for incorporation into semiconductor fabrication processes employed by most manufacturers. DUV systems cost approximately 4 million dollars each with an additional cost for investment in appropriate facilities to house the systems.

Thus, there continues to exist in the integrated circuit manufacturing community a need to accommodate highly complex circuitry image patterns of powerful integrated circuits, and to overcome the inherent field size limitations associated with current photolithographic techniques in a cost efficient manner. The present invention fulfills these needs.

SUMMARY OF THE INVENTION

In broad and general terms, one aspect of the present invention provides a substantial increase in the functionality of an integrated circuit by fabricating on a single die a plurality of independent function regions representing discrete integrated circuit components that form a single integrated circuit from the function regions thereon. Another aspect of the present invention provides for increased reliability by producing fields bearing the image patterns of an integrated system of independent function regions that eliminates interconnections having sub-micron dimensions along the stitching boundaries between adjacent subfields that comprise the fields. The present invention further provides a method and apparatus for forming an integrated circuit utilizing both conventional reticle formation techniques and optical correction reticle formation techniques.

In accordance with one aspect of the present invention, one or more reticles are produced using optical correction techniques to form a standard portion of an integrated circuit design. A further aspect of the present invention includes producing one or more reticles with conventional photolithographic techniques to form a custom portion of the integrated circuit design. A combination of the standard portion and the custom portion provides the final desired integrated circuit structure.

In accordance with one aspect of the present invention, one set of photolithographic reticles is patterned to collectively represent the integrated circuitry structure of a single functional region comprising a custom portion of an integrated circuit design. Another set of reticles is patterned to collectively represent the integrated circuitry structure comprising a standard portion of an integrated circuit design, such as a microprocessor, RAM (Random Access Memory), ROM (Read Only Memory), or some other form of standard logic. The reticle set defining the custom portion is preferably produced by conventional photolithographic techniques. The reticle set defining the standard portion is preferably produced using optical correction techniques, including phase-shift grating techniques. Each of the reticle sets is preferably patterned to include a plurality of input and output lines for establishing signal connection between the respective input and output lines of the function blocks represented by each set of reticles.

An important aspect of the present invention involves the interconnecting, or stitching, of the subfields defining individual function blocks to form a composite field representative of an integrated system. The input and output lines of the individual function blocks are preferably stitched together after the function blocks have been formed on the substrate die. One or more layers of conductive material are preferably formed over the plurality of function blocks on the die using additional reticles to interconnect selectively the respective input and output lines of the function blocks. Stitching together the relatively small number of input and output lines of the function blocks in accordance with the present invention eliminates any need to align and connect millions of fine line, or sub-micron, interconnects associated with conventional stitching processes.

Still another aspect of the present invention concerns the fabrication of large integrated circuit systems on a single wafer die in a manner that effectively overcomes the image field limitations associated with conventional photo-patterning techniques. As previously discussed above, conventional photolithographic imaging tools are only capable of producing fields with a maximum area of approximately 4.0 cm$^2$ if fine line structures with dimensions in the sub-micron range are involved. Thus, conventional stitching techniques are capable of producing composite fields no larger than 4.0 cm$^2$ in area. In contrast, the present invention effectively overcomes the inherent image field limitations by providing fields representative of individual function blocks having a small number of relatively wide input and output lines. Any sub-micron structures defining a function block are then included within one of the individual fields, so that stitching together the function blocks is accomplished simply and more reliably by interconnecting the larger input and output lines of the respective function blocks. By eliminating sub-micron interconnects at the stitching boundaries, and instead stitching together a minimal number of wide input and output lines, the fields representative of the independent function blocks effectively may be enlarged to a maximum area of about 4.0 cm$^2$. Accordingly, significantly larger composite fields can be fabricated by stitching together two or more fields-each with a maximum field area of 4.0 cm$^2$— so as to form a complex integrated system on a single die.

A designer, in accordance with the present invention, can often satisfy a significant number of unique design requirements by integrating one or more standard devices, or elements, into the design, and then designing only the customized, or non-standard, circuitry needed to complete the design. In this regard, a substantial investment of money design time, and layout time commonly associated with conventional practices of repeatedly fabricating new reticles that represent standard function blocks or devices can be obviated. Moreover, defects associated with fabricating the composite reticles are substantially reduced through the use of the well-tested, standard reticle sets, thereby increasing the yield.

Additionally, use of optical correction techniques to produce the reticles of the standard portion increases the resolution capabilities of small dimension structures within the standard portion of the design. The cost of utilizing optical correction techniques is distributed over several design applications when the standard portion reticles are used for more than one design application in accordance with the present invention. Thus, the present invention presents an efficient, cost effective compromise in integrated circuit design incorporating both conventional and enhanced reticle formation techniques.

The novel features of the present invention will be better understood from the following detailed description, considered in connection with the accompanying drawings. It should be expressly understood, however, that the drawings are for purposes of illustration and description only, and are not intended as a definition of the limits of the present invention.

DETAILED DESCRIPTION OF THE PREFERRED EMBODIMENT

Figure 1:
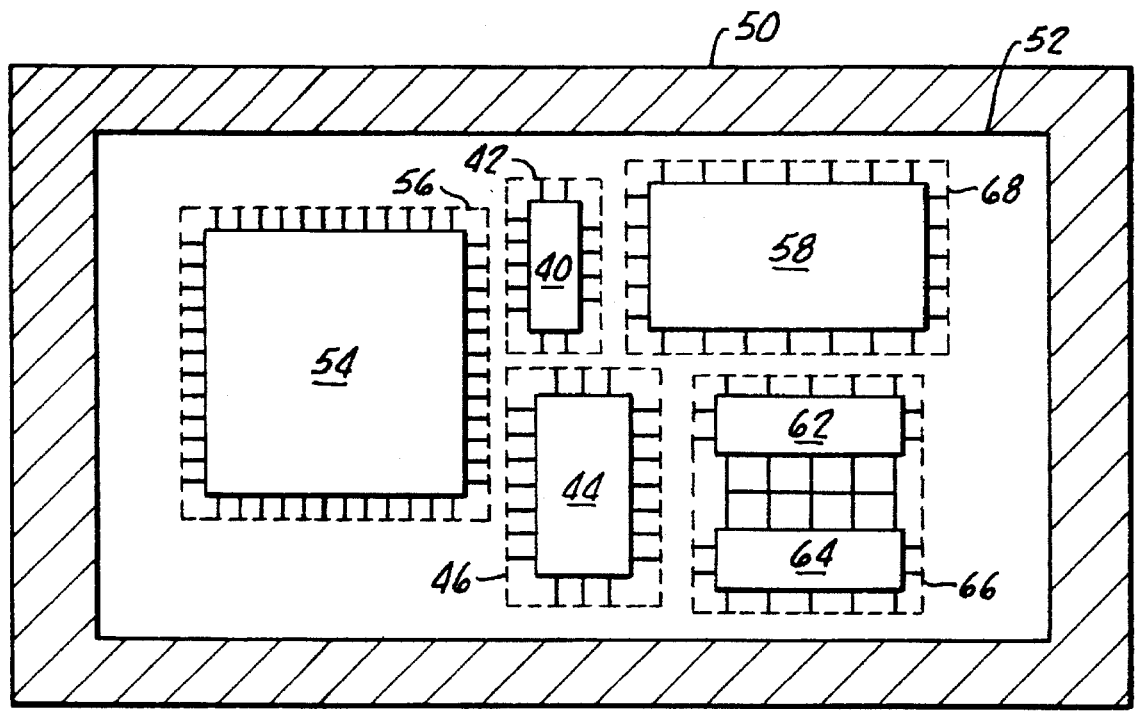
FIG. 1 is a top view of a composite field formed by stitching together the reticles representative of several individual function circuitry blocks in accordance with the present invention.

Referring to the figures, and more particularly to FIG. 1, there is shown a substrate 50 including a field 52 representative of several function blocks 40, 44, 54, 58, 62, and 64, which together form a complex integrated system on the composite field 52. Preferably, substrate 50 is a semiconductor wafer substrate suitable for patterning into an integrated circuit. Each of the function block patterns on the field 52 can be considered to be electrically independent with respect to all other function blocks on the field 52. Considering for example function block 54, a plurality of input lines and output lines extend outwardly from function block 54 and preferably terminate at predetermined locations along the perimeter of a sub-field 56. The input lines and output lines of the function blocks on field 52 are interconnected with respective input and output lines of other function blocks on field 52 during a subsequent fabrication process, as discussed below in greater detail.

An individual function block may, for example, define a microprocessor, a gate array, local memory, or other standard or customized logic circuitry. Each function block comprising field 52 defines a fully functional, individual integrated circuit component or device that, in accordance with conventional integrated circuit fabrication methodologies, would otherwise be packaged as individual chips. It should be noted that an individual sub-field on field 52, sub-field 66 for example, may define more than one function block thereon, such as the sub-blocks 62 and 64 shown in FIG. 1. The sub-blocks 62 and 64 are shown being interconnected within the sub-field 66 by a number of interconnect lines, some of which may have width dimensions in the sub-micron range. Sub-blocks 62 and 64 further include a plurality of input lines and output lines preferably terminating at prescribed locations along the perimeter of sub-field 66. Sub-micron structures are generally included within each subfield, with the subfields produced on the field 52 having varying dimensions depending on, for example, the complexity of the circuitry included within each sub-block.

The capability to automatically generate a specific stitching pattern to interconnect a system of function blocks comprising a field 52 is particularly useful when standard reticles are used in conjunction with non-standard or custom reticles to form a composite field 52. As further illustrated in FIG. 2, the field 52 is shown divided into a standard portion 70 and a custom portion 72.

The standard portion of the field 52 comprises subfields 74 and 80. Preferably, subfields 74 and 80 comprise standard circuit elements capable of being used in several different designs, e.g., a standard microprocessor circuit or memory circuit. In accordance with one aspect of the present invention, standard portion 70 is produced using reticles formed by phase-shift/optical proximity correction (OPC) techniques. Phase-shift techniques for reticle production are well known to those skilled in the art. Examples of suitable phase-shift reticle production methods include U.S. Pat. No. 5,208,125 issued May 4, 1993 to Lowrey, et al., entitled "Phase Shifting Reticle Fabrication Using Ion Implantation", and U.S. Pat. No. 4,764,432 issued Aug. 16, 1988 to Kalbitzer entitled "Photo-mask with Regions Having Differing Optical Transmissivities". The cost typically associated with producing reticles with phase-shift techniques to acquire better resolution of circuit features is distributed over several design applications when the reticles are used repeatedly for a standard portion of the designs in accordance with the present invention.

The custom portion 72 of field 52 comprises sub-fields 88, 90, and 92. Sub-fields 88, 90, and 92 preferably comprise custom circuit elements of a design. The reticle formation methods used to produce custom portion 72 suitably are conventional reticle formation techniques well understood by those skilled in the art. As discussed in the background section, typical reticle production includes forming a pattern in a photoresistive layer overlying a substrate layer of silicon dioxide. The formed pattern preferably represents a desired integrated circuit pattern.

One advantage of employing conventional reticle formation techniques for the custom portion of a design is a reduction in production costs for the incorporation of the custom portion in a design. By way of example, an application specific integrated circuit (ASIC) typically is formed by reticle sets produced using conventional reticle formation techniques. With the present invention, an ASIC design may be produced with a combination of reticle sets forming a standard portion and a custom portion of the design.

The use of conventional reticle formation techniques for the custom portion of an ASIC design creates little or no increase to the typical costs of ASIC production. By way of example, typical costs of reticles produced using conventional formation techniques are approximately three thousand dollars per layer. For an average of twenty layers per reticle set, the typical cost amounts to approximately sixty thousand dollars ($60K) per reticle set. Typical costs of reticle formation using OPC or phase-shift techniques are approximately twenty thousand dollars ($20K) per layer. Under a mix-and-match approach, wherein OPC/phase-shift techniques are used to form only the more critical layers, i.e., about six out of every twenty layers, the cost of the reticle set production increases about 170% from $60K to one hundred sixty-two thousand ($162K) dollars.

The use of more expensive reticle formation techniques, such as phase-shift techniques, for an entire reticle set would significantly increase the cost of ASIC production, considering relatively few wafers are produced with an ASIC reticle set over the life of an ASIC product. However, the use of more expensive techniques for forming the reticle set for a standard portion of a design in accordance with the present invention would not increase the cost of ASIC production. The reticles formed for the standard portion of a design, e.g. a memory portion of a design, may be repeatedly used in more than one integrated circuit design. The increased cost for use of more expensive reticle formation techniques for the standard reticles may then be distributed over the costs of each separate design rather than a single design.

After fabricating the reticle sets for the custom portion 72 and the standard portion 70 of the design, the designer need only design the specific stitching pattern to provide the necessary interconnecting lines 86 to couple the custom portion 72 and the standard portion 70. The stitching pattern may then be automatically generated in the manner discussed herein.

Figure 2:
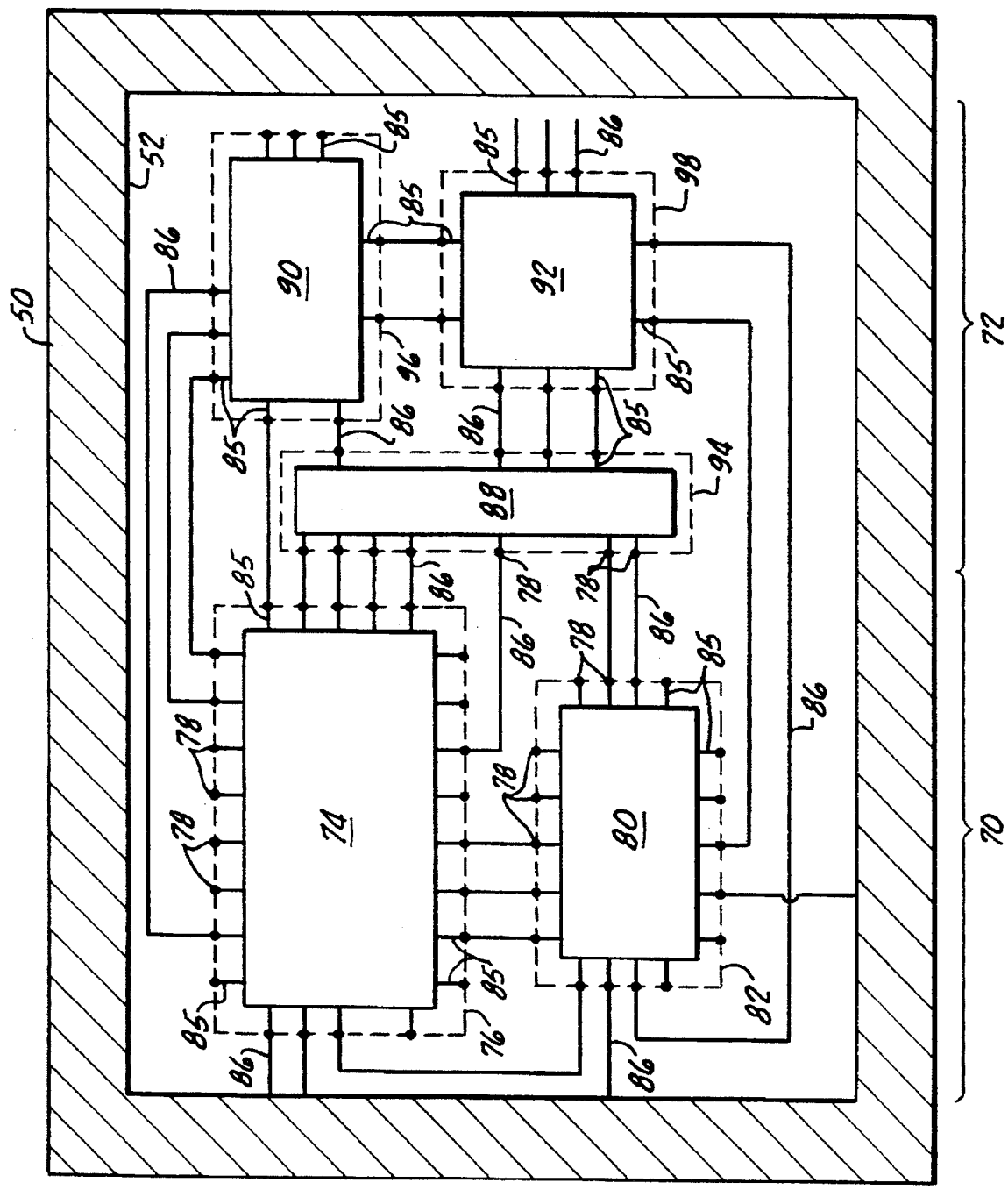
FIG. 2 is a top view of a composite field formed in accordance with the present invention by stitching together several individual functional blocks that are interconnected.

Another important advantage of the present invention, illustrated in FIG. 2, involves a novel methodology of stitching together the sub-fields 76, 82, 94, 96, and 98 bearing the image patterns of the independent function blocks 74, 80, 88, 90, and 92 respectively that together form the composite field 52. Preferably, each of the function block patterns are transferred from their respective reticles to specific locations on substrate 50 to form the composite field 52 using a known photolithographic imaging process. After completion of this transfer procedure, each of the function blocks patterned on substrate 50 in accordance with the present invention may be considered to be electrically independent with respect to other function blocks on the field 52. Each function block, however, includes a plurality of input and output lines 85 that may be subsequently stitched together with respective input and output lines 85 of other function blocks comprising field 52. The input and output lines 85 of one or more function blocks may also be stitched in such a way as to extend to the periphery of the field 52 to form connections with contact pads (not shown) of the integrated circuit die fabricated using the composite substrate 50.

The process of stitching, in accordance with the present invention, involves selectively interconnecting the input and output lines of a plurality of function blocks formed on the die. By way of illustration, and not limitation, the desired interconnections 86 may be fabricated by providing one or more layers of conductive material over the function blocks formed on the die. An insulating layer, such as a layer of oxide material, may first be formed over the function blocks prior to applying a first layer of conductive material. The conductive layer may then be patterned to form conductive pathways 86 that interconnect the respective input and output lines 85 of the function blocks 74, 80, 88, 90, and 92.

Additional layers of conductive material, separated by layers of insulating material, may be subsequently formed over the first layer of conductive material to provide for a complex network of interconnections 85 between the function blocks. One or more reticles may then be fabricated with a specific pattern of interconnect line images in order to produce the desired stitching pattern on a layer of conductive material.

In a preferred embodiment, the input and output lines 85 and the conductive pathways 86 provided for stitching the function blocks together have a width dimension in excess of one micron, or generally greater than the overlay accuracy of the imaging system, for instance greater than 2 micron. Because of these relatively wide interconnects, minor alignment errors or superposition errors that typically occur during the stitching process have little effect on the integrity of the interconnections. For example, a superposition error may result in a constriction or other deformation of the wide line interconnect. The interconnect, however, will remain serviceable notwithstanding the deformation. The same superposition error would normally cause a failure or conductive gap in a sub-micron interconnection, such as the fine line interconnect associated with conventional reticle stitching techniques.

The substrate 50 shown in FIG. 2 further illustrates another important advantage of the present invention. Due in large part to the small number of relatively wide input and output lines 85, the input lines and output lines 85 of each function block on the field 52 can be terminated at fixed locations 78 with respect to the field boundaries. In one embodiment of the present invention, each input and output line 85 of each function block preferably terminates at a specific location along the perimeter of the corresponding sub-field. For example, the input and output lines 85 of function block 74 terminate at predefined locations 78 along the perimeter of the sub-field 76. Thus, when the function block patterns are transferred to a semiconductor substrate, interconnecting lines 86 may be patterned on one or more conductive layers above the function blocks to register with the predefined termination locations 78 of each input and output line 85. The input and output lines 85 may be connected with corresponding interconnecting lines 86 above the terminating locations 78 by known means, typically involving the formation of a vertical conductive pathway, or via, between the input line or output line 85 and the interconnect line 86. Thus, by establishing a standard convention describing the termination location of each input line and output line 85 provided for each function block, the stitching pattern comprising the conductive pathways 86 which are required to interconnect the input and output lines of the functional blocks 74, 80, 88, 90, and 92 can be automatically generated.

Returning to the individual function blocks 74, 80, 88, 90, and 92 illustrated in FIG. 2, one important advantage of the present invention concerns the increase in both complexity and size of a function block defined within its respective subfields 76, 82, 94, 96, and 98 on the field 52. Current photolithographic imaging tools, as previously discussed, are only capable of producing a field with a maximum area of 4.0 cm$^2$ where the field includes fine line structures with dimensions in the sub-micron range. A field defining an integrated circuit fabricated in accordance with a conventional reticle stitching technique is thus limited in size to 4.0 cm$^2$. In stark contrast, the function blocks 74, 80, 88, 90 and 92 formed on the field 52 in accordance with the present invention may each occupy fields having a maximum area of 4.0 cm$^2$, which, in turn, may be utilized to fabricate a composite field 52 several times larger in area than 4.0 cm$^2$.

It is to be understood, however, that future improvements in photolithographic imaging techniques will likely provide the capability to pattern circuitry images having structures with sub-micron dimensions on reticle fields larger than 4.0 cm$^2$ in dimension. Accordingly, the size of the reticles defining the function blocks 74, 80, 88, 90, and 92 need not be limited to 4.0 cm$^2$, and may be increased in size without departing from the scope or spirit of the present invention. Such improvements in no way limit the novel features of the present invention.

Having discussed in detail the use of stitching to provide design flexibility in accordance with the present invention, multiple independent functional components or elements on a single die are appropriately interconnected to form a powerful and complex integrated circuit system. A single chip developed in accordance with the present invention, therefore, is capable of performing system level processing that would otherwise have to be accomplished by several independent chips fabricated using conventional methods.

Figure 3:
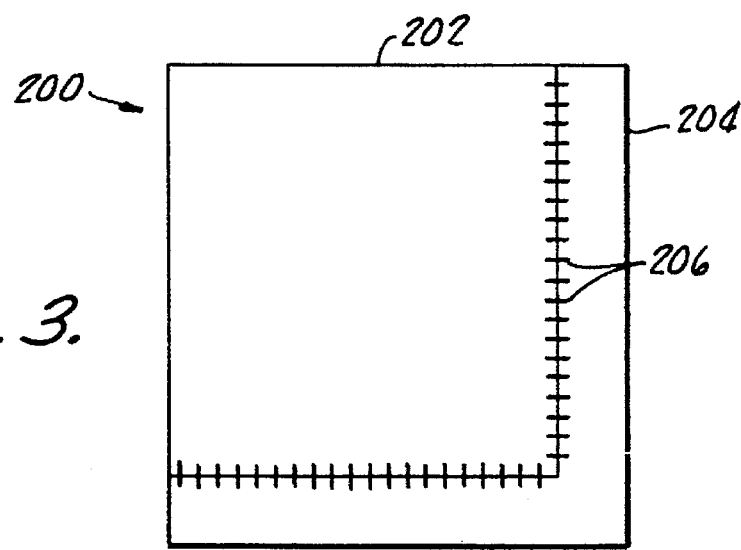
FIG. 3 is an illustration of an overall view of a semiconductor die having both a standard portion and a custom portion produced in accordance with the present invention.

An illustration representative of a single chip formed in accordance with the present invention is illustrated in FIG. 3. As shown, a single die 200 comprises a standard portion 202 and a custom portion 204. Stitching lines 206 represent the interconnection of standard portion 202 and custom portion 204. The concept of developing systems of independent functional components on a single die may be referred to as "System Level Integration", or SLI by those skilled in the art. System level integration, in accordance with the present invention, provides integrated circuit manufactures with a number of advantages.

A significant advantage, for example, concerns a substantial reduction in the number of individual chips that would otherwise be required to provide the equivalent functionality of a single multiple-component chip. A concomitant reduction in the area of a printed circuit board required for mounting a single chip, rather than several chips, is realized, thus allowing for increased miniaturization of electronic systems constructed using SLI technology.

Another advantage of the present invention involves the performance and reliability of an integrated circuit chip fabricated using the novel reticle stitching methodology of the present invention. An electronic system comprising one or more multiple-component chips, rather than numerous individual chips, can achieve higher operational speeds resulting in part from a reduction in the total number of interconnects made through the printed circuit board supporting the electronic system circuitry. The shorter interconnects between components integrated on a single die, as contrasted to the relatively long conductive pathways required to interconnect multiple components mounted on a printed circuit board, result in a substantial reduction of capacitive and inductive loadings associated with longer interconnects, thereby providing an increase in system processing speeds.

A substantial increase in the yield of electronic systems comprised of one or more multiple-component chips fabricated in accordance with the present invention can be realized through the elimination of numerous manufacturing defects that occur during the construction of electronic systems on a printed circuit board. For example, the defects associated with mounting and soldering chips onto the printed circuit board are significantly reduced since several individual chips can be replaced with a single multiple-component chip fabricated using the novel reticle stitching technique of the present invention. Moreover, a multiple-component chip is inherently more reliable because it dissipates considerably less power than an equivalent number of individual chips, and obviates the need for the many soldered wires, pins, cables, and other various support attachments associated with conventional packaging methods.

It will, of course, be understood that various modifications and additions can be made to the preferred embodiments of the present invention without departing from the scope or spirit of the present invention. Accordingly, the scope of the present invention should not be limited by the particular embodiments discussed above, but should be defined only by the claims set forth below and equivalents thereof.

We claim:

1. A method for forming an integrated circuit comprising:
   forming a first reticle set using optical proximity correction techniques for a standard portion of an integrated circuit;
   forming a second reticle set using conventional photolithographic techniques for a custom portion of the integrated circuit;
   transferring said first reticle set and said second reticle set to a substrate; and
   interconnecting lines of said standard portion and said custom portion to form said integrated circuit.

2. A method as recited in claim 1 wherein said standard portion comprises a microprocessor circuit.

3. A method as recited in claim 1 wherein said standard portion comprises a memory circuit.

4. A method as recited in claim 1 wherein said substrate comprises a semiconductor wafer.

5. A method as recited in claim 1 wherein said standard portion and said custom portion each comprise at least one function block.

6. A method as recited in claim 5 wherein said at least one function block of each of said standard portion and said custom portion has input and output lines terminating at predetermined locations.

7. A method as recited in claim 6 wherein said input and output lines of said function blocks of said custom portion and said standard portion form a portion of said interconnecting lines.

8. A method as recited in claim 1 wherein said interconnecting lines have a width greater than about 1 micron.

9. A method for forming an integrated circuit comprising:
   producing at least one first reticle by optical proximity correction techniques;
   producing at least one second reticle by conventional photolithographic techniques; and
   combining said first and second reticles on a substrate to form an integrated circuit.

10. A method as recited in claim 9 wherein said optical proximity correction techniques comprise phase-shift techniques.

11. A method as recited in claim 9 wherein said at least one first reticle comprises a standard portion of said integrated circuit.

12. A method as recited in claim 11 wherein said standard portion comprises a microprocessor circuit.

13. A method as recited in claim 11 wherein said standard portion comprises a memory circuit.

14. A method as recited in claim 9 wherein said at least one second reticle comprises a custom portion of said integrated circuit.

15. A method as recited in claim 9 wherein each of said first reticle and said second reticle comprise a function region and an input and output line representation region.

16. A method as recited in claim 15 wherein said step of combining comprises stitching said input and output line representations of said first reticle with said input and output line representations of said second reticle on said substrate.

17. A method as recited in claim 16 wherein said input and output line representations are located at designated locations on said first reticle and said second reticle.

18. A method as recited in claim 15 wherein said input and output line representations are greater than about 1 micron in width.

19. A method as recited in claim 9 wherein said substrate is a semiconductor wafer.

20. An integrated circuit formation apparatus comprising:
    at least one first reticle produced by optical proximity correction techniques;
    at least one second reticle produced by conventional photolithographic techniques; and
    an interconnector of said first reticle and said second reticle on a substrate to form an integrated circuit.

21. An apparatus as recited in claim 20 wherein said at least one first reticle comprises a standard portion of said integrated circuit.

22. An apparatus as recited in claim 20 wherein said at least one second reticle comprises a custom portion of said integrated circuit.

23. An apparatus as recited in claim 20 wherein each of said first reticle and said second reticle further comprises a function region and an input and output line representation region.

24. An apparatus as recited in claim 23 wherein said interconnector combines said input and output line representation regions of said first reticle and said second reticle.

25. An apparatus as recited in claim 23 wherein input and output line representations of said input and output line representation region are at least one micron in width.

* * * * *